United States Patent [19]
Jun et al.

[11] Patent Number: 5,949,705
[45] Date of Patent: Sep. 7, 1999

[54] DRAM CELL, DRAM AND METHOD FOR FABRICATING THE SAME

[75] Inventors: Young Kwon Jun; Yoo Chan Jeon, both of Seoul, Rep. of Korea

[73] Assignee: LG Semicon Co., Ltd., Cheongju-si, Rep. of Korea

[21] Appl. No.: 09/035,841

[22] Filed: Mar. 6, 1998

Related U.S. Application Data

[62] Division of application No. 08/852,072, May 6, 1997, Pat. No. 5,771,189.

[30] Foreign Application Priority Data

May 16, 1996 [KR] Rep. of Korea .................. 96-16459

[51] Int. Cl.$^6$ .................. G11C 11/24; G11C 11/34; H01L 27/108
[52] U.S. Cl. .................. 365/149; 365/174; 257/296
[58] Field of Search .................. 365/149, 174; 257/296, 300, 304, 305

[56] References Cited

U.S. PATENT DOCUMENTS

| | | | |
|---|---|---|---|
| 4,677,589 | 6/1987 | Haskell et al. | 365/149 |
| 4,763,181 | 8/1988 | Tasch, Jr. | 257/300 |
| 5,146,300 | 9/1992 | Hamamoto et al. | 257/300 |
| 5,375,086 | 12/1994 | Wahlstrom | 365/149 |
| 5,526,305 | 6/1996 | Levi | 365/149 |
| 5,790,451 | 8/1998 | Jun | 365/149 |
| 5,801,412 | 9/1998 | Tobita | 257/296 |
| 5,811,848 | 9/1998 | Chao | 257/296 |
| 5,841,690 | 11/1998 | Shibutani et al. | 365/149 |
| 5,856,940 | 1/1999 | Rao | 365/149 |

Primary Examiner—Trong Phan

[57] ABSTRACT

The DRAM cell includes a first transistor, a second transistor, and a capacitor. The first and second transistors each have a gate, a source, and a drain electrode. The gate electrode of the second transistor is connected to one of the source and drain electrodes of the first transistor, and a first electrode of the capacitor is connected to the gate electrode of the second transistor. Also, a second electrode of the capacitor is connected to one of the source and drain electrodes of the second transistor. One of the source and drain electrodes of the second transistor not connected to the second electrode of the capacitor is connected to the gate electrode of the second transistor. Accordingly, the second transistor is on when a logic value of "1" is stored in the gate thereof, and off when a logic value of '0' is stored in the gate thereof. A wordline is connected to the gate electrode of the first transistor, a bitline is connected to the one of the source and drain electrodes of the first transistor not connected to the gate of the second transistor, and a reading line is connected to the second electrode of the capacitor. By applying a voltage corresponding to a logic value to the bitline, and selectively turning on the writing wordline, the logic value on the bitline is stored in the gate electrode of the second transistor. During a reading operation, a reference voltage is applied to the bitline, and a reading voltage is applied to the reading wordline. Then, the first transistor is selectively turned on by applying a voltage to the writing wordline. Based on the fluctuation in the reference voltage applied to the bitline, the logic value stored in the gate of the second transistor is easily determined.

9 Claims, 7 Drawing Sheets

DRAM CELL, DRAM AND METHOD FOR FABRICATING THE SAME

This application is a divisional of copending application Ser. No. 08/852,072 filed on May 6, 1997, now U.S. Pat. No. 5,771,189, the entire contents of which are hereby incorporated by reference.

BACKGROUND OF THE INVENTION

1. Field of the Invention

The present invention relates to a Dynamic Random Access Memory (DRAM) device, and more particularly, to a DRAM cell, a DRAM and a method for fabricating the same.

2. Discussion of the Related Art

In general, a DRAM provides high memory capacity and low cost owing to its simple configuration, which includes a single transistor and a single capacitor. In this regard, it has been widely used in a variety of electrical products including computer systems. Recently, its application has been expanded.

Because of high memory capacity and increased processing speed trends in computers, a demand for DRAMs with high packing density exists in DRAM markets.

However, it is difficult to expect further increases in packing density in DRAMs having a single transistor and a single capacitor due to limitations imposed by the process technology, such as optical lithography using an infrared ray, generally adopted in fabricating such DRAMs.

A conventional DRAM cell will now be described with reference to the appended drawings. FIG. 1 shows a circuit diagram of a conventional DRAM cell. The conventional DRAM cell having a single transistor and a single capacitor includes a bitline, a wordline, an access transistor 2, a storage capacitor 4 and a sensing amplifier (not shown). A gate 6 of the access transistor 2 is connected to the wordline. The source 8 and drain 10 electrodes of the access transistor 2 are connected to the storage capacitor 4 and the bitline, respectively.

A plate electrode 12 of the capacitor 4 is connected to a reference voltage. An input port of the sensing amplifier is connected to the bitline and the other port is connected to the reference voltage. Data is stored in the storage capacitor 4 through the source and drain electrodes 8 and 10 from the bitline when the access transistor 2 is turned on. The stored data is transferred from the capacitor 4 to the bitline through the source and drain electrodes 8 and 10 when the access transistor 2 is turned on again. A logic value of the data stored in the capacitor 4 is determined by comparing a level of the transferred data with the reference voltage of the bitline.

The capacitor 4 of the DRAM cell generally includes a storage electrode 14 of $n^+$ poly Si, a plate electrode 12 and a dielectric firm between these two electrodes.

Data writing and reading operations in the DRAM cell having a configuration as aforementioned will now be described in detail. Electrons are redistributed on the surface of the storage electrode 14 under the dielectric film by means of a voltage equal to ½ Vcc applied to the plate electrode 12 when no data is stored in the storage electrode 14. Thus, a depletion layer of electrons is formed on the boundary of the dielectric film and the storage electrode 14.

The Vcc voltage is applied to the bitline and the wordline in writing data '1'. As a result, a gate electrode voltage and a source electrode voltage in the access transistor 2 increase to the Vcc voltage level so that the access transistor 2 is turned on.

A ½ Vcc−ΔV voltage is applied to the storage electrode layer. The voltage difference Δ is discussed in detail below. Therefore, electrons flow from the storage electrode layer having high potential to the source electrode 8 having low potential, thereby enlarging the depletion layer in the storage electrode layer. In addition, the depletion layer remains in the storage electrode layer if the wordline voltage is lowered to a ground potential voltage. This state of the cell indicates logic '1' in binary.

In writing data '0' in a memory cell, the Vcc voltage is applied to the gate 6 of the access transistor 2 under the state that the ground potential voltage is applied to the bitline. The electrons flow from the source electrode 8 having high potential to the storage electrode layer having low potential since ½ Vcc−Δ voltage in the storage electrode layer is higher than the source electrode voltage '0'. As a result, the electrons are accumulated in the storage electrode layer and the depletion layer is restored to an accumulation layer.

The electrons remain in the storage electrode layer if the wordline voltage is lowered to the ground voltage. This state of the cell indicates logic '0' in binary. The data reading operation of the DRAM cell will be described below. The Vcc voltage is applied to the wordline while the bitline is pre-charged to a ½ Vcc voltage level. At this time, the access transistor 2 is turned on and the data stored in the storage electrode layer of the capacitor is transferred to the bitline. The voltage of the bitline varies depending on the stored charge quantity. The varied voltage of the bitline is compared with a reference voltage of a bitline in a dummy cell through the sensing amplifier which function as a comparator circuit. The voltage difference is amplified so that the logic value is determined as '1' when the varied voltage of the bitline is higher than the reference voltage. The logic value is determined as '0' when the varied voltage is lower than the reference voltage.

The voltage difference can be expressed as follows.

$$\Delta V = (\tfrac{1}{2}) \text{Vcc } Cs/(Cs+Cb)$$

Here, Cs is a storage capacitance and Cb is a bitline capacitance. The error caused by determining the logic value is reduced since the higher the Cs/Cb ratio is the higher the ΔV voltage is. However, the conventional DRAM cell has several problems. The voltage difference ΔV between the bitline voltage and the reference voltage based on which the sensing amplifier is capable of making a determination is about 100–200 mV or more. Thus, the storage capacitance to the bitline capacitance ratio γ (where γ=Cs/Cb) had better be high. The area of the cell is considerably reduced if the density of the DRAM increases, nevertheless, the bitline capacitance and the sensitivity of the sensing amplifier are not improved. For this reason, it is likely that the signal-to-noise ratio degrades and the cell transistor may malfunction.

The reliability of the DRAM cell may be degraded by a soft error due to α particles. That is, a pair of electron-holes occur by ionization impact when a α particle comes into collision with the semiconductor substrate. The minority carrier of the electron-holes is captured in the storage electrode varying the charge quantity therein. To eliminate such a soft error due to α particles, the area of the storage electrode has to be increased three-dimensionally or a dielectric layer having a high dielectric ratio has to be formed. However, the three-dimensional increase of the storage electrode causes higher steps therein, which makes forming the device through exposure and etching processes more difficult.

When forming the dielectric layer, it is difficult to obtain a high packing density of the DRAM cell due to undesired characteristics such as leakage current and breakdown voltage resulting from deficiencies in thin film fabrication techniques.

SUMMARY OF THE INVENTION

Accordingly, the present invention is directed to a DRAM cell, a DRAM and a method for fabricating the same that substantially obviates one or more of the problems due to limitations and disadvantages of the related art.

An object of the present invention is to provide a DRAM cell, a DRAM device and a method for fabricating the same in which a capacitor has a minimum area and step difference to improve packing density and reliability of the device.

To achieve these and other advantages and in accordance with the purpose of the present invention, as embodied and broadly described, the DRAM cell according to the present invention includes: a first transistor having a gate, source and drain electrode; a second transistor having a gate, source, and drain electrode, the gate of the second transistor being connected to one of the source and drain electrodes of the first transistor; and a capacitor having a first electrode connected to the gate electrode of the second transistor and a second electrode connected to one of the source and drain electrodes of the second transistor. The DRAM according to the present invention includes: a plurality of writing and reading wordlines; a plurality of bitlines for inputting or outputting data; and a plurality of cells, each cell including, a first transistor having a gate, source and drain electrode, a second transistor having a gate, source, and drain electrode, the gate electrode of the second transistor being connected to one of the source and drain electrodes of the first transistor, and a capacitor having a first electrode connected to the gate electrode of the second transistor and a second electrode connected to one of the source and drain electrodes of the second transistor, and wherein the gate electrode of the first transistor in the respective cells is connected to a corresponding writing wordline, one of the source and drain electrodes of the first and second transistors in the respective cells is connected to a corresponding bitline, and the second electrode of the capacitor in the respective cells is connected to a corresponding reading wordline.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
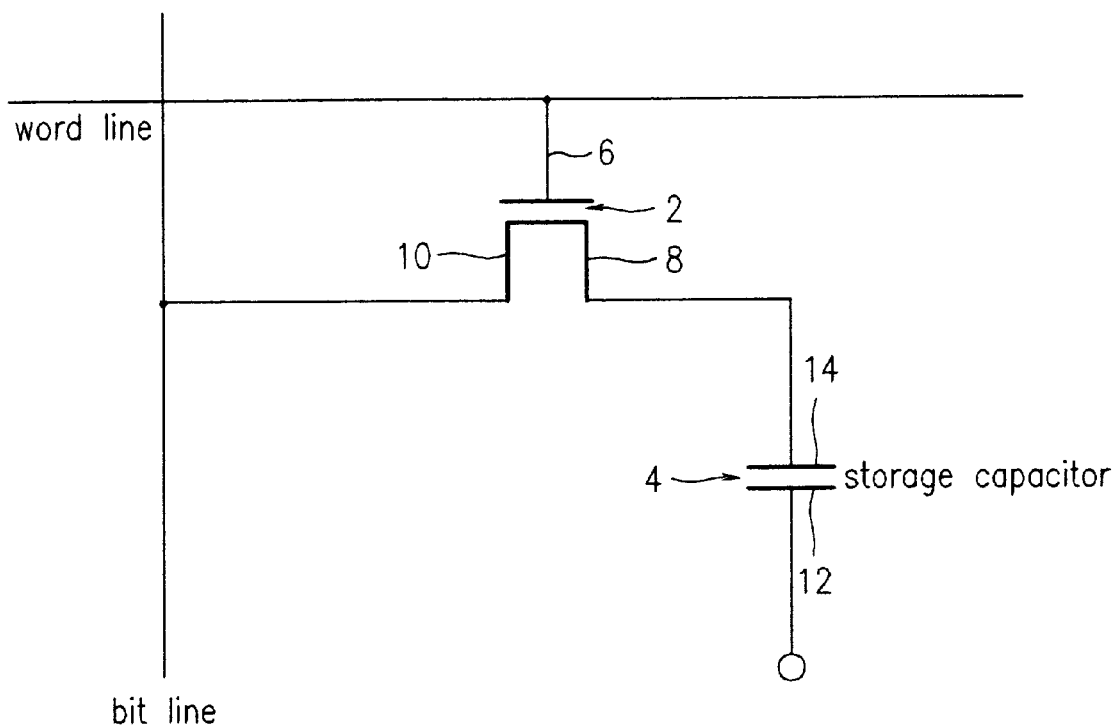
FIG. 1 is a circuit diagram of a conventional DRAM cell.
Figure 2:
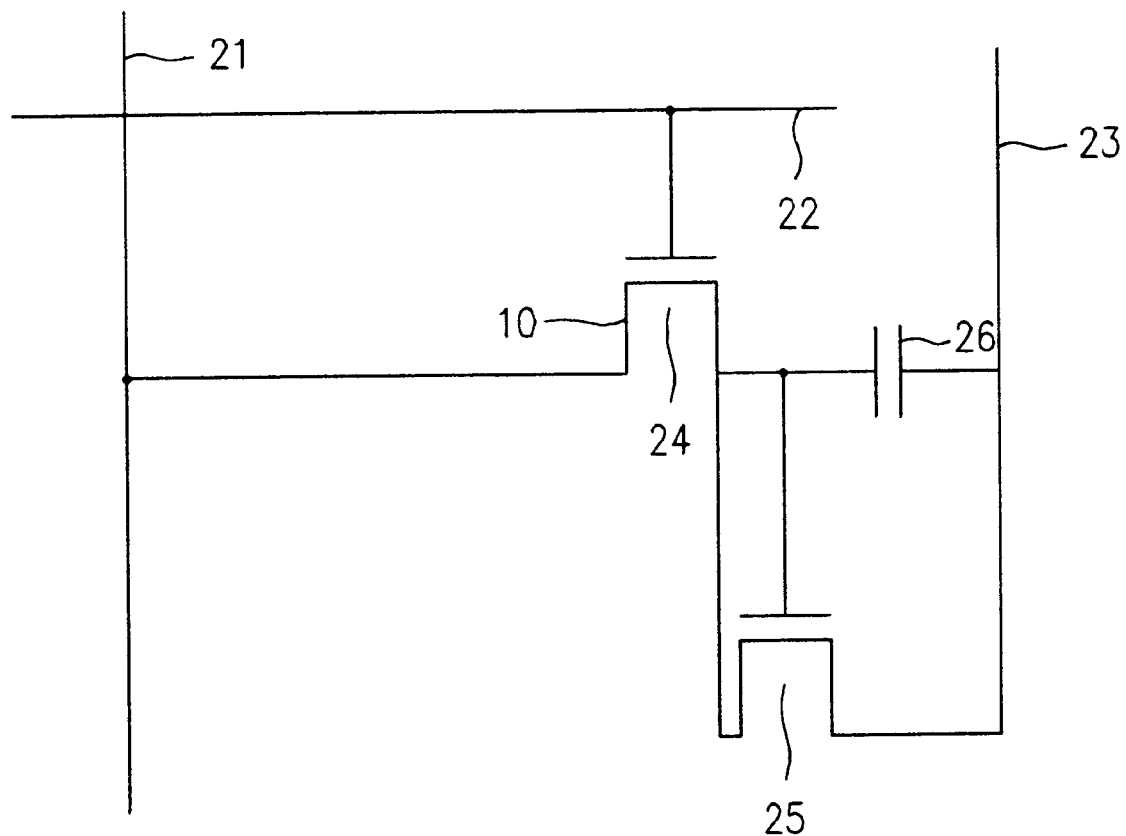
FIG. 2 is a circuit diagram of a DRAM cell according to the present invention.

FIG. 2 is a circuit diagram of a DRAM cell according to the present invention. The DRAM cell of the present invention includes a first transistor 24 and a second transistor 25. The first transistor 24 has a gate electrode connected to a writing wordline 22, and a source electrode connected to a bitline 21. The second transistor 25 has a drain electrode connected to a reading wordline 23 and an upper or opposing electrode of a capacitor 26, and a source electrode connected to the drain electrode of the first transistor 24. The drain electrode of the first transistor 24 and the gate and source electrode of the second transistor 25 are connected to a lower or storage electrode of the capacitor 26. An input port of a sensing amplifier is connected to the bitline 21. The other port is connected to a predetermined reference voltage or a bitline in a dummy cell. Charge data corresponding to a logic value '1' or '0' in binary is stored in the gate of the second transistor 25. In the DRAM cell of the present invention as aforementioned, the on or off state of the second transistor 25 does not vary so long as the stored charge data is greater than or equal to a threshold voltage Vt of the second transistor 25. Thus, unlike the conventional art, it does not matter how the charge quantity is stored in the capacitor.

The data writing operation of the DRAM cell will be briefly described below. A writing voltage is applied to the gate of the first transistor 24 through the writing wordline 22 to turn on the first transistor 24. Then, the data from the bitline 21 is stored in the lower or storage electrode of the capacitor 26, (i.e., the gate of the second transistor 25) through the source and drain electrodes of the first transistor 24. Once the data is stored, a ground voltage is applied to the gate of the first transistor 24 through the writing wordline 22 to turn off the first transistor 24. As a result, the stored data remains in the gate of the second transistor 25.

The data reading operation of the DRAM cell will be briefly described below. First, a reading voltage is applied to the drain electrode of the second transistor 25 through the reading wordline 23. A voltage is then applied to the writing wordline to turn on the first transistor 24. Depending on the logic value stored by the gate of the second transistor 25, the second transistor 25 will be on or off. When a logic value of "1" is stored, the second transistor 25 is on, and when a logic value of "0" is stored, the second transistor 25 is off. Accordingly, the reading voltage applied to the reading wordline 23 will be applied to the bitline 21 depending on the stored logic value. The voltage applied to the bitline 21 and the predetermined reference voltage of a bitline in a dummy cell are compared with each other and amplified to determine the state of the charge data stored in the gate of the second transistor 25.

The operation of the DRAM cell is described in greater detail after the following description of forming the DRAM cell according to the present invention.

Figure 3A:
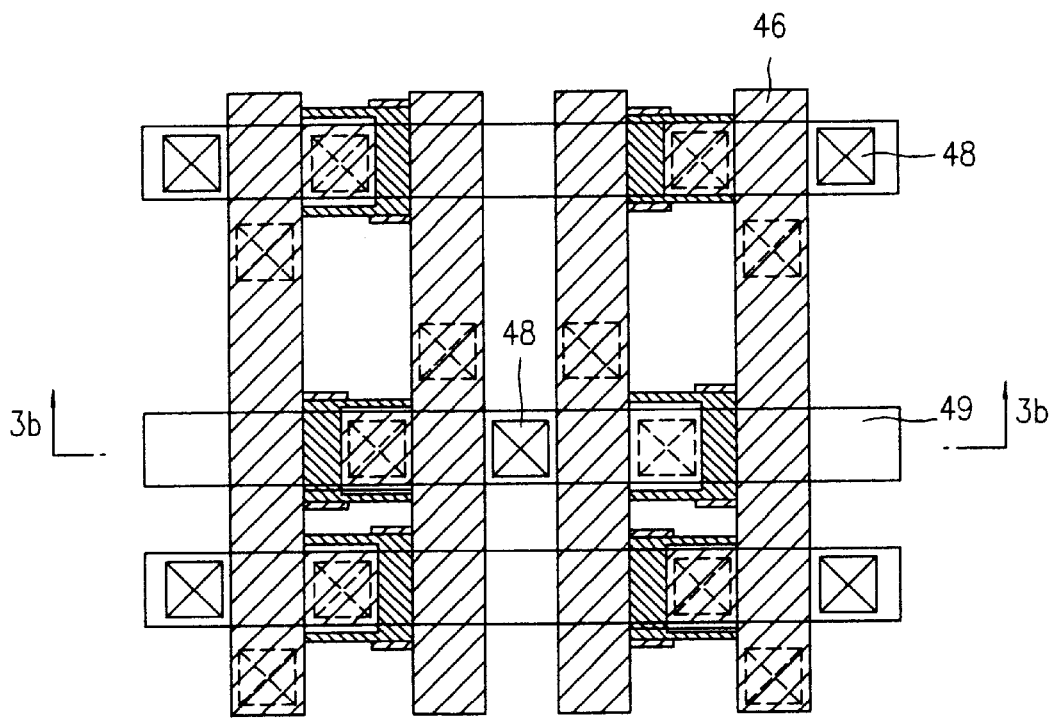
FIGS. 3a and 3b are a layout and a sectional view, respectively, of a DRAM cell according to the present invention.
Figure 3B:
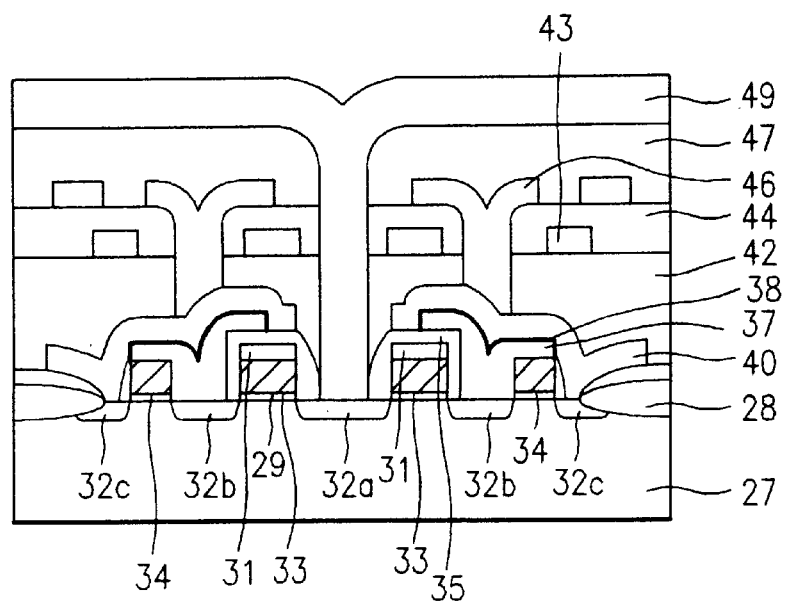

The structure of the DRAM cell according to the present invention having a circuit configuration as aforementioned will be described with reference to FIGS. 3a and 3b. FIGS. 3a and 3b are a layout and a sectional view, respectively, of a DRAM cell according to the present invention.

The DRAM cell of the present invention includes: a field oxide film 28 on an isolation region of a semiconductor substrate 27; first, second and third impurity diffused regions 32a, 32b and 32c on a predetermined portions of an active region defined by the field oxide film 28; a gate insulating film 29 on a channel region excluding the first, second and third impurity diffused regions 32a, 32b and 32c; a first gate 33 on the gate insulating film 29 in the channel region between the first and second impurity diffused regions 32a and 32b; a second gate 34 on the gate insulating film 29 in the channel region between the second and third impurity diffused regions 32b and 32c; a first insulating film 31 on only the first gate 33; a second insulating film 35 on and surrounding the first insulating film 31 and the first gate 33; a storage electrode 37 in contact with the second impurity diffused region 32b and the second gate 34, and extending over a portion of the second insulating film 35; a dielectric film 38 on the storage electrode 37 which includes a high dielectric film with a dielectric ratio of 3.5 or more or a stack film having an ON (oxide/nitride) structure; an opposing electrode 40 on the dielectric film 38 and in contact with the third impurity diffused region 32c; a third insulating film 42 on the opposing electrode 40, the insulating film 35 and the field oxide 28; first conductive lines 43 extending in a first direction on the third insulating film 42, and being in contact with the first gate 33; a fourth insulating film 44 on the first conductive line 43 and the third insulating film 42; second conductive lines 46 extending in the first direction on the fourth insulating film 44, and being in contact with the opposing electrode 40; a fifth insulating film 47 on the second conductive line 46 and the third insulating film 42; and a third conductive line 49 on the fifth insulating film 47, extending perpendicular to the first and second conductive lines 43 and 46, and in contact with the first impurity diffused region 32a via a contact hole 48.

A method for fabricating the DRAM cell as aforementioned will be described with reference to FIGS. 4a to 4k. FIGS. 4a to 4k are sectional and layout views of the sequential process steps to form a DRAM cell according to the present invention.

Figure 4A:
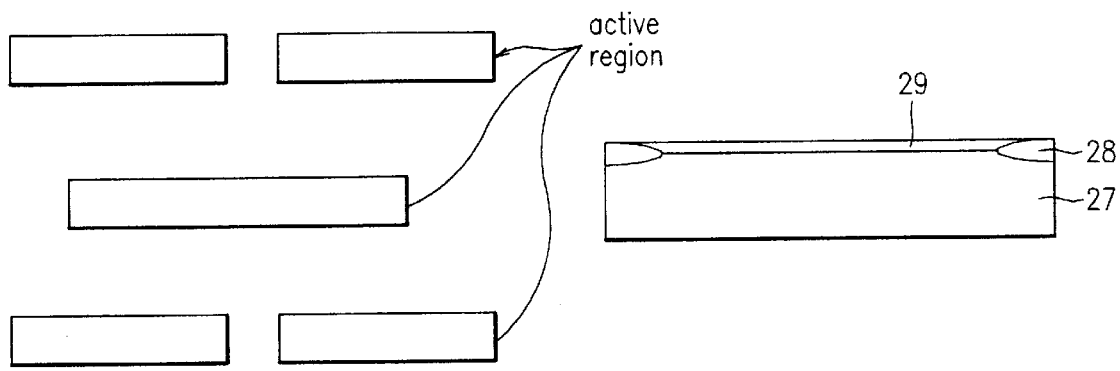
FIGS. 4a to 4k are sectional and layout views of sequential process steps to form a DRAM cell according to the present invention.

As shown in FIG. 4a, the field oxide film 28 is formed on an isolation region of the semiconductor substrate 27 by a thermal oxidation process between 800–1100° C. using a pad oxide film and a nitride film as a mask to prevent oxidation. Afterwards, the gate insulating film 29 is formed on the active regions defined by the field oxide film 28.

Figure 4B:
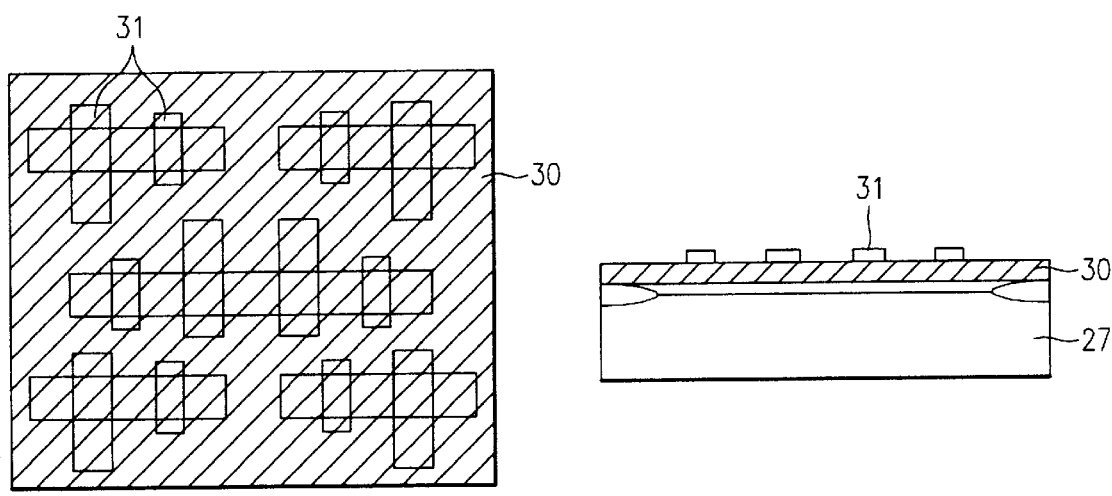

Then, a polysilicon layer 30 is formed by low pressure chemical vapor deposition (LPCVD) process, as shown in FIG. 4b. Subsequently, the first insulating film 31 is formed on the polysilicon layer 30 to a thickness of 500 Å–2000 Å, and it is selectively etched using a sensitivity film (not shown) as a mask so that a gate pattern mask is formed.

Figure 4C:
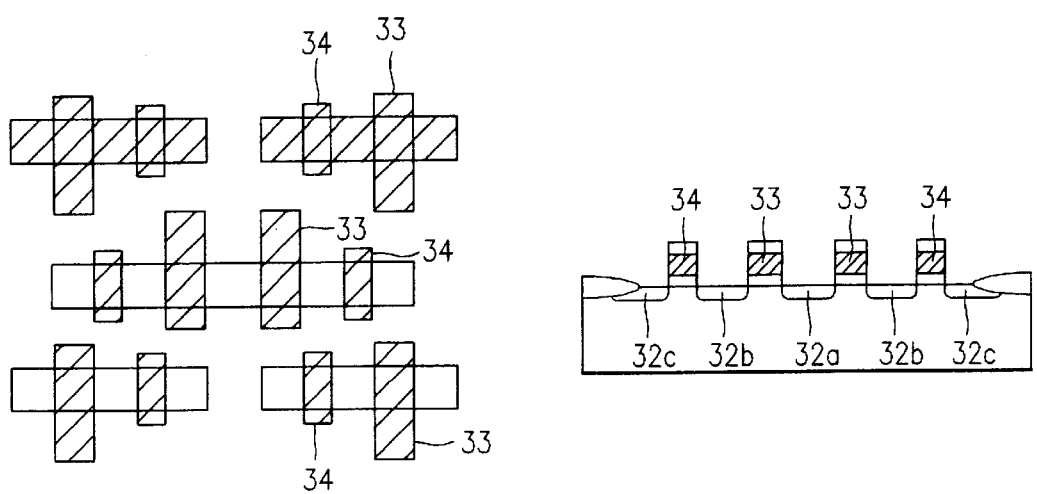

To minimize intervals between the gates, the formation of the sensitivity film is conducted twice, thereby minimizing pattern intervals of the first insulating film 31. As shown in FIG. 4c, the polysilicon layer 30 is selectively etched using the gate pattern mask to form the first gate 33 and the second gate 34. Each second gate 34 is formed on a predetermined portion of the field oxide film 28 as well as the active region.

Further, as shown in FIG. 4c, the first, second and third impurity diffused regions 32a, 32b and 32c are formed by ion implantation and diffusion of conductivity type impurities into the substrate 27 using the field oxide film 28 and the first and second gates 33 and 34 as a mask.

Figure 4D:
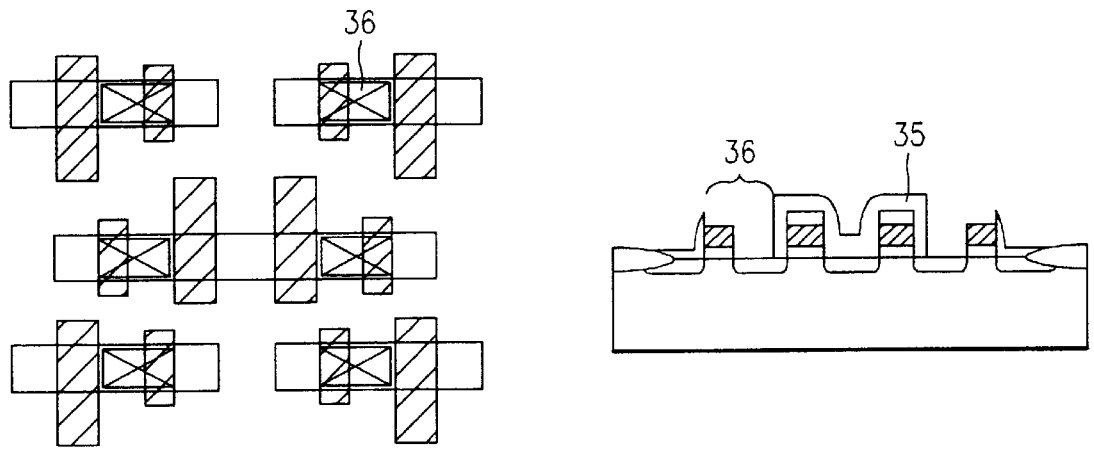

As shown in FIG. 4d, the second insulating film 35 is formed on the semiconductor substrate 27 including the first, second and third impurity diffused regions 32a, 32b and 32c, and then the second insulating film 35 is selectively removed to expose portions of the second impurity diffused region 32b and the second gate 34 to form a first contact hole 36.

Figure 4E:
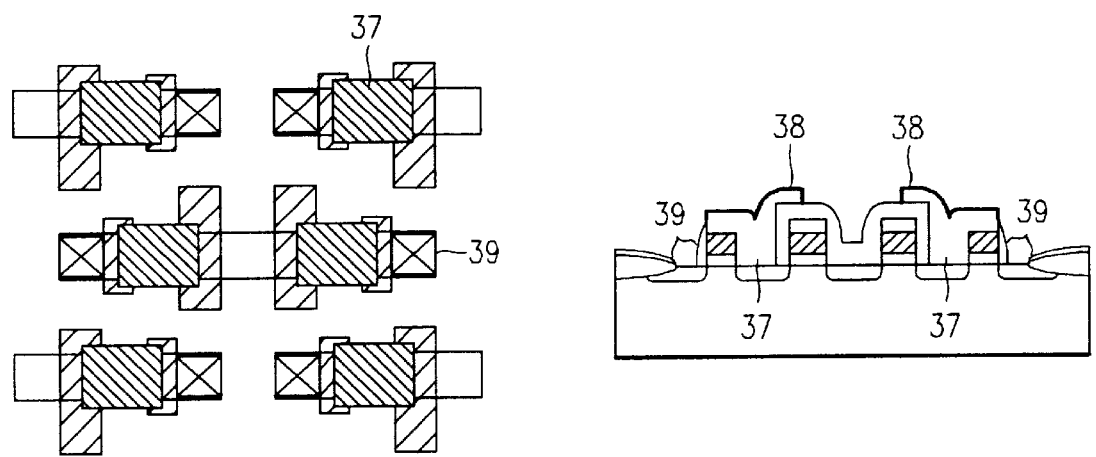

Moreover, as shown in FIG. 4e, a polysilicon layer is formed on the substrate 27 including the first contact hole 36, and is selectively etched. After etching, portions of the polysilicon are in contact with the exposed second impurity diffused region 32b, remain on the upper portion of the second gate 34 and remain on some portion of the first gate 33. As a result, the storage electrode 37 of the capacitor 26 is formed.

As further shown in FIG. 4e, on the storage electrode 37, the dielectric film 38 is formed. The dielectric film 38 is formed of a nitride film and a stack film having an ON structure of a nitride film and oxide film. Instead of the stack film, a high dielectric film having a dielectric ratio of 3.5 or more can be used. A second contact hole 39 is then formed to expose the third impurity diffused region 32c by removing the second insulating film 35 on the third impurity diffused region 32c.

Figure 4F:
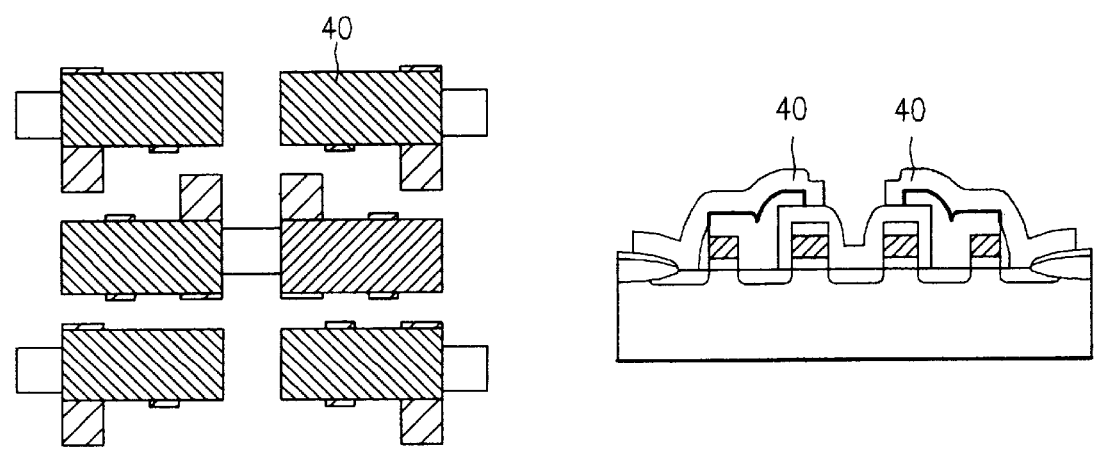

Subsequently, as shown in FIG. 4f, a polysilicon layer is formed on the substrate 27 including dielectric film 38 by LPCVD so that the polysilicon layer contacts the third impurity diffused region 32c through the second contact hole 39. Then, the polysilicon layer is selectively etched to form the opposing electrode 40 of the capacitor 26.

Figure 4G:
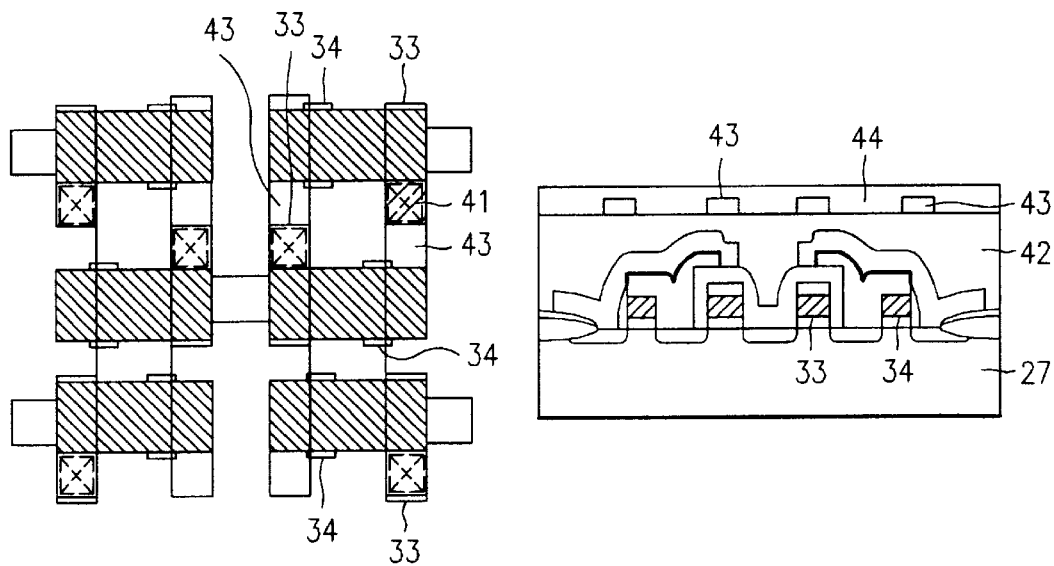

As shown in FIG. 4g, the third insulating film 42 is formed on the substrate 27. Then, the third insulating film 42 on the first gate 33 is selectively removed to form a third contact hole 41 and expose a portion of the first gate 33 on the field oxide film 28. Further, a conductive material layer is formed on the third insulating film 42 and over the third contact hole 41, and is patterned at predetermined intervals to form the first conductive lines 43. The fourth insulating film 44 is then formed on the substrate 27.

Figure 4H:
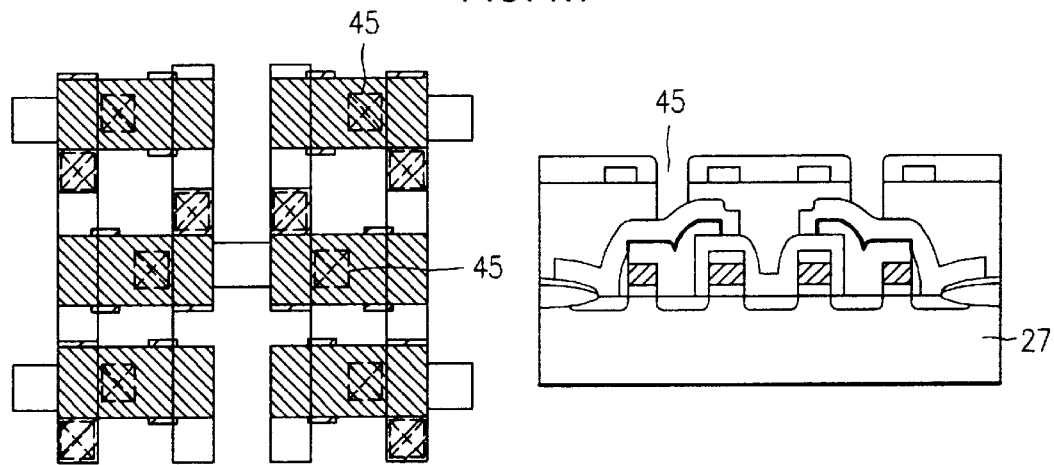

As shown in FIG. 4h, the fourth insulating film 44 and the third insulating film 42 are selectively etched to expose the opposing electrode 40, partially, so that a fourth contact hole 45 is formed.

Figure 4I:
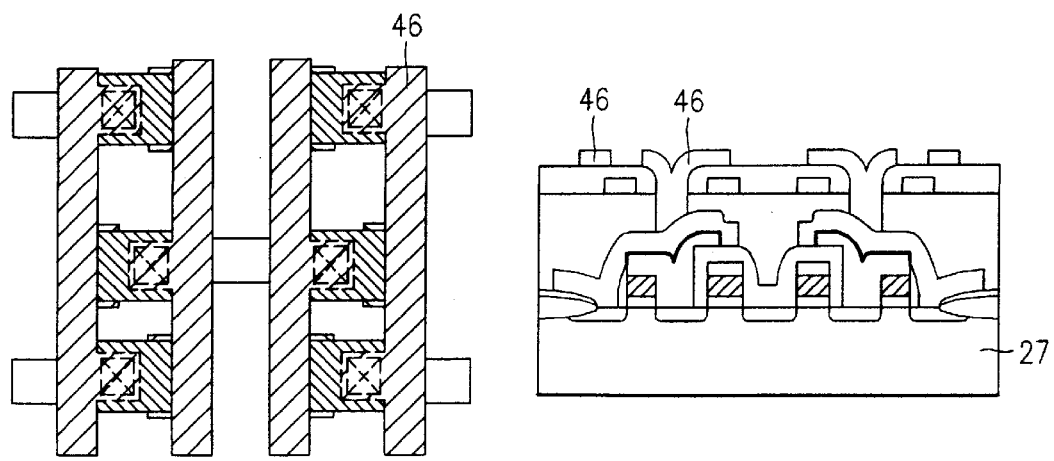

Subsequently, as shown in FIG. 4i, a conductive material layer is formed over the substrate including the fourth contact hole 45, and patterned to form the second conductive lines 46.

Figure 4J:
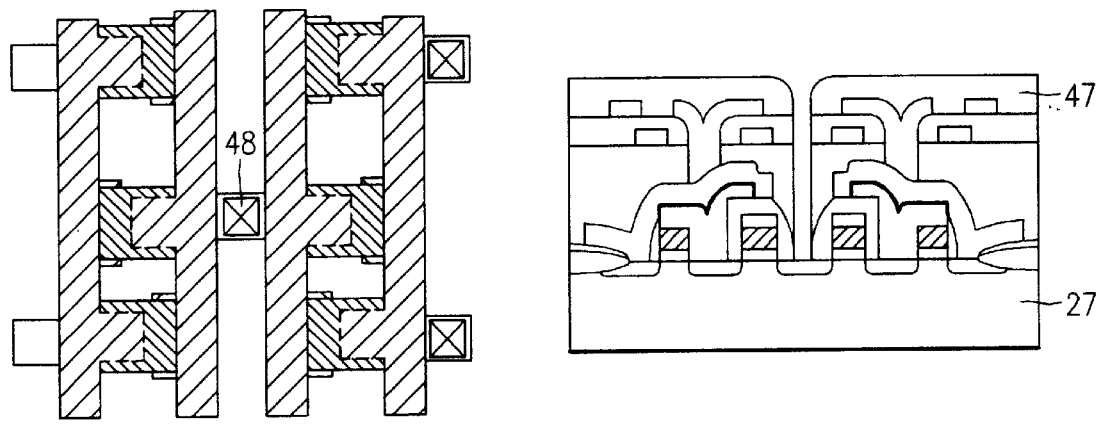

As shown in FIG. 4j, the fifth insulating film 47 is formed over the substrate 27. Then, a fifth contact hole 48 is formed by selectively etching the fifth insulating film 47, the fourth insulating film 44, and the third insulating film 42 to expose the first impurity diffused region 32a.

Figure 4K:
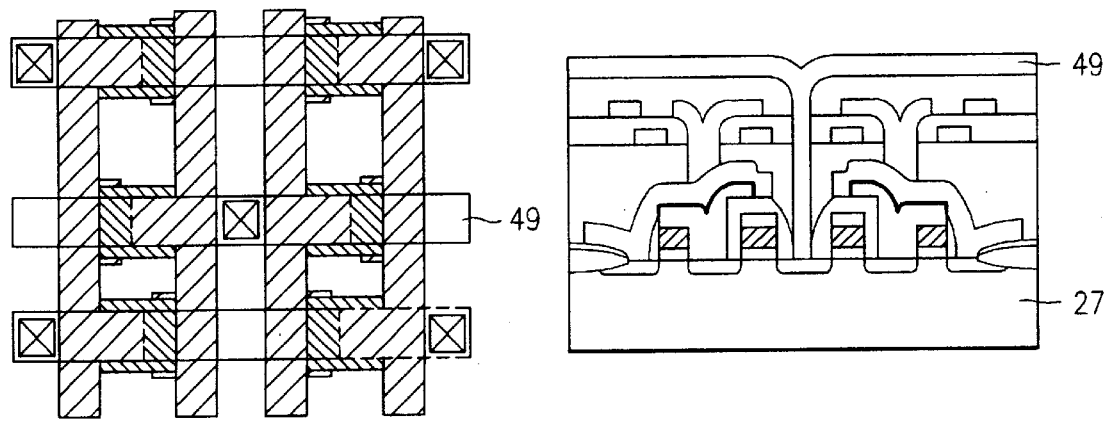

As shown in FIG. 4k, a conductive material layer is formed over the substrate including the fifth contact hole 48, and is selectively etched to form the third conductive line 49 perpendicular to the first and second conductive lines 43 and 46.

For the circuit configuration, the first conductive line 43 corresponds to the writing wordline 22, the second conductive line 46 to the reading wordline 23, and the third conductive line 49 to the bitline 21. The first, second, third, fourth, and fifth insulating films 31, 35, 42, 44, and 47 include an oxide film or a nitride film.

The operation of the DRAM cell formed according to the process steps as aforementioned will now be described in detail. The data writing and reading operations of the DRAM cell according to the present invention depend on logic values. For instance, during a reading operation, the second transistor 25 is turned off when a logic value stored in the second gate 34 indicates logic '0'. The second transistor 25, however, turns on when a logic value stored in the second gate 34 indicates '1' in binary. In both instances, the predetermined reference voltage is applied to the bitline 21.

First, the data writing operation of the DRAM cell according to the present invention will be described below. In general, in a standby state, a ground potential voltage is applied to the semiconductor substrate 27, and the ground potential voltage or a low voltage is applied to the writing wordline 22 and the reading wordline 23 so that the second transistor 25 is turned off. That is, the drain electrode of the second transistor 25 is electrically disconnected from the bitline 21.

The writing wordline 22 is selected to perform a data writing operation. A high voltage $V_H$ (where, $V_H$ is greater than or equal to the threshold voltage to operate the first transistor 24) is applied to the first gate 33. Consequently, a voltage $V_H-V_{TH}$, where the voltage $V_{TH}$ represents the amount the voltage $V_H$ is lowered by the gate insulating film 29, is induced in the semiconductor substrate 27 so that electrons around the semiconductor substrate 27 are redistributed.

That is, a negative(−) charge region is formed around the boundary between the gate insulating film 29 and the substrate 27. Thus, an inversion layer is formed in the channel region under the gate insulating film 29, and a positive charge region (i.e., depletion region) is formed around this inversion layer and the impurity diffused regions 32 and 32b.

Once the inversion layer is formed in the channel region, the first transistor 24 is turned on so as to form an electrical path between the source and drain electrodes thereof.

At this time, the electron potential 0 of the drain electrode becomes higher than the electron potential $-qV_H'$ of the bitline 21 in the case where a high voltage $V_H'$ is applied to the bitline 21 to write the logic value '1'. Thus, electrons flow from the drain electrode to the bitline 21 and the charge leaks out, thereby lowering the electron potential of the drain electrode. As aforementioned, with the redistribution of the electrons, once the electron potential of the bitline 21 balances with the electron potential of the drain electrode, charge is not transferred any more so that the writing operation is complete. Since the drain electrode is combined with the second gate 34 through the storage electrode 37 of the capacitor 26, the second gate electrode of the second transistor 25 maintains the same electron potential as the drain electrode of the first transistor 24.

The ground potential voltage or a low voltage $V_L$ is then applied to the first gate 33 through the writing wordline 22 so that the first transistor 24 is turned off. In other words, the voltage $V_L-V_{TH}$ is induced to the semiconductor substrate 27 so that the electrons in the substrate 27 are redistributed. As a result, a positive(+) charge region is formed on the surface of the semiconductor substrate 27 around the boundary between the gate insulating film 29 and the substrate 27, due to depletion of the electrons. A negative(−) charge region of the same amount as the positive(+) charge is formed therearound. Thus, the inversion layer on the semiconductor substrate 27 under the gate insulating film 29 is restored to a depletion layer so that the first transistor 24 turns off.

Turning off the first transistor 24 closes the path between the source and drain electrodes thereof, and the charge data of the logic value '1' corresponding to $V_H'$ is, thus, stored in the second gate 34. This stored data remains until the next reading operation is performed.

In the case where the ground potential voltage or a low voltage $V_L$ is applied to the bitline 21 to write data corresponding to the logic value '0', the data writing may be performed in the same manner as above. That is, the writing wordline 22 is selected and a high voltage $V_H$, or a voltage slightly higher than the high voltage $V_H$, is applied to the first gate 33 to turn on the first transistor 24. Once the electrical path between the source and drain electrodes is formed by turning on the first transistor 24, the electron potential 0 of the drain electrode connected to the second gate 34 becomes lower or same as the electron potential 0 or $-qV_L$ of the bitline 21. The electrons flow from the bitline 21 to the drain electrode (i.e., the second gate 34 connected with the drain electrode) so that the electron potential of the second gate 34 increases to 0 or $-qV_L$. Once the electron potential increases, the electron potential of the bitline 21 becomes the same as the drain electrode of the first transistor 24. As a result, charge is no longer transferred; thereby completing the data writing operation.

Thereafter, if the ground potential voltage or the low voltage $V_L$, a voltage less than or equal to the threshold voltage for tuning off the transistor 24, is applied to the first gate 33 through the writing wordline 22, the first transistor 24 is turned off and the path between the source and drain electrodes of the first transistor 24 closes. As a result, the data of the logic value '0' corresponding to the electron potential of 0 or $-qV_L$ is stored in the second gate 34. The stored data remains until the next data reading operation is performed.

The ground potential voltage is applied to the reading wordline 22 when the voltage of the bitline 21 is at the ground potential voltage during the standby state, and the predetermined reference voltage is applied to the reading wordline 22 when the voltage of the bitline 21 is pre-charged by the predetermined reference voltage during the writing operation. This prevents the second transistor 25 from being turned on during the data writing operation.

The data reading operation of the DRAM cell according to the present invention will be described below. In general, during the standby state, the semiconductor substrate 27 is maintained at ground potential voltage, and the writing wordline 22 and the reading wordline 23 are maintained at the ground potential voltage or the low voltage so that the first transistor 24 is turned off. That is, the drain electrode of the first transistor 24 is electrically disconnected with the bitline 21. The reading wordline 23, during a data reading operation, is selected and the voltage of the bitline 21 is lowered to the ground potential voltage. A reading voltage $V_M$ (where, $V_M$ is greater than or equal to the voltage required for turning on the second transistor 25) is applied to the reading line 23 and then the write line 22. If the second gate 34 has the charge corresponding to $V_H'$, in case where the charge data of the logic value '1' is stored in the second gate 34, the second transistor 25 is turned on. Consequently, the electrical path between the source and drain electrodes of both the first and second transistor 24 and 25 opens so that the voltage $V_M$ is transferred to the bitline 21 to indicate the storage of a logic "1".

If, however, the second gate 34 has the charge corresponding to 0 or $V_L$, in case where the charge data of the logic value "0" is stored in the second gate 34, the second transistor 25 is turned off. Consequently, the electrical path between the source and drain electrodes of the second transistor 25 is closed so that the bitline 21 remains at the logic value '0' because the voltage $V_M$ is not transferred to the bitline 21.

In data reading, the next data reading operation is performed wherein the bitline 21 is pre-charged by the predetermined reference voltage. That is, for data reading operation, the reading voltage $V_M$, greater than the predetermined reference voltage applied to the reading wordline 23 at the standby state, is applied to the reading wordline 23.

Further, in the data reading operation, it should be noted that the reading voltage $V_M$ is first applied to only the reading wordline 23 under the condition that the ground potential voltage is applied to the writing wordline 22 so that the first transistor 24 is off when the second transistor 25 is turned on. It should also be noted that the reading voltage $V_M$ is then applied to the writing wordline 22 so that the first and second transistors 24 and 25 are both turned on.

In the data writing and reading operations as described above, the charge data corresponding to the logic value '1' or '0' can be stored in the second gate 34, and the stored charge data only flows out to the bitline 21 when a logic value '1' is stored. The logic value of the charge data can be determined so far as the charge data stored in the second gate 34 of the second transistor 25 does not leak out below the value of the threshold voltage. Thus, enough time exists to perform a data refreshing operation. Furthermore, because it is possible that the reference voltage is or is not applied to the bitline 21 depending on the logic value of the charge data written in the memory cell unit, it is possible to repeat the data writing and reading operations.

The reset operation of the stored charge data will now be described. In the reset operation, there are three sequential steps of: (1) applying the threshold voltage or more to the first gate 33; (2) applying the ground potential voltage to the bitline 21; and (3) storing the logic value '0' in the second gate 34. Such steps allow the charge data stored in the second gate 34 to be reset to the ground potential voltage.

The DRAM device of the present invention as aforementioned has the following advantages. The second transistor 25 is turned on only when the charge data corresponding to the logic value '1' is stored in the second gate 34 making it is easy to determine the stored logic value. In addition, since no three-dimensional capacitor structure is employed, resulting in a reduction of step heights, device performance and packing density can be improved.

It will be apparent to those skilled in the art that various modifications and variations can be made in the DRAM cell, the DRAM device and the method for fabricating the same of the present invention without departing from the spirit or scope of the invention.

What is claimed is:

1. A DRAM cell comprising:

a semiconductor substrate;

a field oxide film formed on an isolation region of the semiconductor substrate and defining an active region;

first, second and third impurity diffused regions formed in the active region;

a gate insulating film formed on channel regions between the first and second impurity diffused regions and the second and third impurity diffused regions;

a first gate formed on the gate insulating film between the first and second impurity diffused regions;

a second gate formed on the gate insulating film between the second and third impurity diffused regions;

a storage electrode in contact with the second impurity diffused region and the second gate;

a dielectric film formed on the storage electrode;

an opposing electrode formed on the dielectric film and in contact with the third impurity diffused region;

a first conductive line in contact with the first gate;

a second conductive line in contact with the opposing electrode; and a third conductive line in contact with the first impurity diffused region.

2. The DRAM cell according to claim 1, wherein the first and second conductive lines are formed on a first direction, and the third conductive line is formed in a second direction perpendicular to the first direction.

3. The DRAM according to claim 1, wherein the dielectric film includes a nitride film.

4. The DRAM according to claim 1, wherein the dielectric film has an ON structure of an oxide film and a nitride film.

5. The DRAM according to claim 1, further comprising:

a first insulating film on the first gate.

6. The DRAM according to claim 1, further comprising:

a first insulating film surrounding the first gate.

7. The DRAM according to claim 1, further comprising:

a first insulating film on the opposing electrode, the first insulating film having a first contact hole formed therein; and wherein the first conductive line contacts the first gate via the first contact hole.

8. The DRAM according to claim 7, further comprising:

a second insulating film formed on the first conductive line and the first insulating film, the second insulating film and the first insulating film having a second contact hole formed therein; and wherein the second conductive line contacts the opposing electrode via the second contact hole.

9. The DRAM according to claim 8, further comprising:

a third insulating film formed on the second conductive line and the second insulating film; and wherein the first, second, and third insulating films have a third contact hole formed therein; and the third conductive line contacts the first impurity diffused region via the third contact hole.

* * * * *